United States Patent

Matsubara

[11] Patent Number: 5,877,085
[45] Date of Patent: Mar. 2, 1999

[54] METHOD OF MANUFACTURING SEMICONDUCTOR DEVICE

[75] Inventor: Yoshihisa Matsubara, Tokyo, Japan

[73] Assignee: NEC Corporation, Tokyo, Japan

[21] Appl. No.: 772,128

[22] Filed: Dec. 20, 1996

[30] Foreign Application Priority Data

Dec. 25, 1995 [JP] Japan .................................. 7-336923

[51] Int. Cl.$^6$ .................................................. H01L 21/28
[52] U.S. Cl. ..................... 438/649; 438/651; 438/655; 438/683
[58] Field of Search ..................... 438/592, 630, 438/649, 651, 655, 664, 682, 683; 257/382, 383, 384, 754, 757, 768, 769, 770

[56] References Cited

U.S. PATENT DOCUMENTS

| | | | |
|---|---|---|---|
| 4,676,866 | 6/1987 | Tang et al. ............................ | 156/643 |
| 4,870,033 | 9/1989 | Hotta et al. ........................... | 438/655 |
| 5,034,348 | 7/1991 | Harswick et al. ..................... | 438/453 |
| 5,041,394 | 8/1991 | Spratt et al. .......................... | 438/655 |
| 5,593,924 | 1/1997 | Apte et al. ............................ | 438/453 |
| 5,635,426 | 6/1997 | Hayashi et al. ....................... | 438/453 |

FOREIGN PATENT DOCUMENTS 63-50038  3/1988  Japan .

Primary Examiner—T. N. Quach
Attorney, Agent, or Firm—Sughrue, Mion, Zinn, Macpeak & Seas, PLLC

[57] ABSTRACT

In a method of manufacturing a semiconductor device, a silicide layer of a refractory metal is formed in a predetermined region of a semiconductor element formed on a silicon semiconductor substrate. In the first film formation step, a first thin film consisting of the refractory metal is formed on the surfaces of the silicon semiconductor substrate and the semiconductor element. In the first heat treatment step, a heat treatment is performed with respect to the silicon semiconductor substrate, the semiconductor element, and the first thin film to form a silicide layer. In the first removal step, the first thin film is removed by etching. In the second film formation step, a second thin film consisting of a refractory metal of the same kind as that of the first thin film is formed. In the second heat treatment step, another heat treatment is performed to make the second thin film contain as a solid solution an oxide of the refractory metal present at the interface with the second thin film, thereby making a layer consisting of the oxide vanish. In the second removal step, the second thin film is removed by etching.

8 Claims, 12 Drawing Sheets

METHOD OF MANUFACTURING SEMICONDUCTOR DEVICE

BACKGROUND OF THE INVENTION

1. FIELD OF THE INVENTION

The present invention relates to a method of manufacturing a semiconductor device and, more particularly, to a method of manufacturing a semiconductor device in which a self-align-silicide film of a refractory metal is formed on the diffusion layer and the gate electrode of a MOS transistor.

2. DESCRIPTION OF THE PRIOR ART

Semiconductor elements continue to shrink in line width and increase in density. At present, super-high-integrated semiconductor devices, such as a memory device or a logic device, which are designed by the size standard (design rule) of 0.15 to 0.25 µm are manufactured. With high integration of semiconductor devices, decreases in widths of the gate electrode and the diffusion layer and a decrease in film thickness of each material layer constituting a semiconductor element have become increasingly important.

The decrease in width of the gate electrode or gate electrode interconnection and the decrease in film thickness of the gate electrode layer inevitably increase the resistances of the interconnections, greatly affecting the circuit delay. When conventional polysilicon is used as an electrode material and an interconnection material, the delay time increases to a non-negligible degree due to the increase in interconnection resistance. Therefore, in micropatterned semiconductor elements as described above, a technique of realizing lower-resistance gate electrodes and interconnections using a silicide of a refractory metal has become indispensable. Particularly, a technique of forming a salicide (self-align-silicide) using, e.g., titanium (Ti) as a refractory metal is important in the manufacturing process of a micropatterned MOS (Metal-Oxide-Semiconductor) transistor.

With further high integration of semiconductor devices, in an insulated gate field effect transistor represented by a MOS transistor, the short channel effect of the transistor must be suppressed by suppressing diffusion of the impurity used for forming the diffusion layer. As a result, if the junction surface of the diffusion layer contacts the silicide region layer, the leakage current due to crystal defects increases, and the switch operation of the transistor cannot be performed. Therefore, the film thickness of the silicide layer must be decreased in addition to realization of a shallow-junction diffusion layer.

A conventional method of manufacturing a MOS transistor having a salicide structure will be explained. FIGS. 1A to 1E are sectional views respectively showing the steps in an example (to be referred to the first conventional method hereinafter) of a conventional salicide formation method.

First, as shown in FIG. 1A, an oxide film serving as an element isolation insulating film 102 is formed in a predetermined region on a silicon substrate 101 by well-known LOCOS (LOCal Oxidation of Silicon). After an impurity for a channel stopper is ion-implanted, a gate insulating film 103 is formed by the thermal oxidation method. Subsequently, a polysilicon film having a film thickness of about 150 nm is formed on the entire surface by CVD (Chemical Vapor Deposition). After an impurity such as phosphorus is doped, this polysilicon film is patterned into a desired shape by the lithography technique and the dry etching technique to form a gate electrode 104 on the gate insulating film 103. A silicon oxide film is deposited on the entire surface using the CVD method and subjected to anisotropic dry etching to form a spacer (side wall) 105 on the side surface of the gate electrode 104. Then, an impurity such as arsenic (As) or boron (B) is doped, and a heat treatment is performed at 800° C. to 1,000° C. to form diffusion layers 106. In the case of an n-channel MOS transistor, arsenic-doped diffusion layers are formed, whereas in the case of a p-channel transistor boron-doped diffusion layers are formed. In either case, the diffusion layers on the two sides of the gate electrode 104 serve as the source and drain regions of the MOS transistor, respectively. In the example shown in FIG. 1A, the diffusion layer 106 on the right side of the gate insulating film 103 coincides with the ion-implanted region for the channel stopper.

As shown in FIG. 1B, a titanium film 107 having a film thickness of about 50 nm is formed on the entire surface by the sputtering method or the like. Upon this film formation, when the substrate is unloaded from the film formation unit and exposed to the outer atmosphere, the surface of the titanium film 107 oxidizes to form a titanium oxide film 108 having a thickness of about 5 nm.

The first heat treatment is performed in a nitrogen atmosphere at normal pressure for 30 sec to 60 sec to silicify the titanium film 107. In this heat treatment, a lamp annealer is normally used, and the heat treatment temperature is set at 600° C. to 650° C. The crystal structures of titanium silicide are classified into the C49 structure having a relatively high electrical resistivity, and the C54 structure having a relatively low electrical resistivity. In this case, as shown in FIG. 1C, silicide layers 109 of the C49 structure having a relatively high electrical resistivity are formed on the exposed surface of the gate electrode 104 and the surfaces of the diffusion layers 106, and titanium nitride layers 110 are formed on the uppermost surfaces. In contrast, oxygen-containing titanium layers 111 which contain unreacted oxygen are formed on the element isolation insulating film 102 and the spacer 105 which are formed of silicon oxide films, and titanium nitride layers 110 are formed on the uppermost surfaces. Further, the titanium film 107 reduces the silicon oxide films serving as the element isolation insulating film 102 and the spacer 105 to form titanium oxide films 108 at the interfaces between these silicon oxide films and the oxygen-containing titanium layers 111.

Next, the resultant structure is dipped in an etching solution mixture of an aqueous ammonia solution, pure water, and a hydrogen peroxide solution to remove the oxygen-containing titanium layers 111 containing unreacted oxygen, and the titanium nitride layers 110, as shown in FIG. 1D. Although the titanium film 107 is dissolved by the etching solution of this composition, the titanium nitride layers 110 are not dissolved by this etching solution but removed by the lift-off effect upon elution of the oxygen-containing titanium layers 111.

By the above steps, the silicide layers 109 of the C49 structure are formed in self-alignment only on the gate electrode 104 and the diffusion layers 106 for forming the source and drain regions. The resultant structure is subjected to the second heat treatment in a nitrogen atmosphere at normal pressure for about 60 sec to cause a crystal structure transition. That is, as shown in FIG. 1E, the silicide layers 109 of the C49 structure are converted into silicide layers 112 of the C54 structure having a relatively low electrical resistivity. As a heat treatment unit at this time, a lamp annealer is used, like in the first heat treatment. The process temperature is set at about 850° C. In this manner, a silicide layer of the C54 structure used as the electrode layer of a semiconductor device can be formed in self-alignment.

On the other hand, Japanese Unexamined Patent Publication No. 63-50038 discloses a method characterized by performing the film formation step of a refractory metal film and the heat treatment step "in situ". This method uses an equipment including a sputtering unit, an electrical furnace unit, and a unit for keeping the respective units in vacuum via an exhaust unit, and the step of forming a refractory metal film by sputtering and the silicification step are continuously executed without exposing the structure to the outer atmosphere. According to this method, a heat treatment for silicification can be executed without forming any oxide layer on the surface of the refractory metal film formed by sputtering. Although Japanese Unexamined Patent Publication No. 63-50038 discloses an example using tungsten (W) or molybdenum (Mo) as the refractory metal, a case wherein the technique disclosed in Japanese Unexamined Patent Publication No. 63-50038 is applied to formation of a titanium silicide film will be explained below. FIGS. 2A to 2E are sectional views respectively showing the steps in a salicide formation method (to be referred to as the second conventional method hereinafter).

The respective steps from formation of a MOS transistor to formation of a titanium film by the sputtering method are performed similar to those in the first conventional method described above. That is, as shown in FIG. 2A, a 300 nm-thick element isolation insulating film 102 is formed by the LOCOS method in a predetermined region on a silicon substrate 101 which is of p-type or has a p-well formed therein. Boron for a channel stopper is ion-implanted in the silicon substrate 101 to form a gate insulating film 103 having a film thickness of about 8 nm by the thermal oxidation method. A polysilicon film having a film thickness of about 100 nm is formed on the entire surface by the CVD method. After an impurity such as phosphorus is doped, this polysilicon layer is patterned by the lithography technique and the dry etching technique to form a gate electrode 104. After a silicon oxide film is deposited on the entire surface by the CVD method to have a film thickness of about 100 nm, anisotropic dry etching is performed to form a spacer 105 on the side surface of the gate electrode 104. Thereafter, diffusion layers 106 are formed by ion implantation of an arsenic impurity.

Next, as shown in FIG. 2B, a titanium film 107 having a thickness of about 20 nm is formed on the entire surface by, e.g., the sputtering method using argon gas. The resultant structure is subjected to a heat treatment in a nitrogen atmosphere without being exposed to the outer atmosphere, thereby forming silicide layers 109 of the C49 structure on the silicon exposed surfaces (FIG. 2C). Since the structure is not exposed to the outer atmosphere, no titanium oxide is formed on the surface of the titanium film 107, and heat treatment of the titanium film 107 can be performed. However, similar to the first conventional method described above, titanium oxide films 108 are formed at the interfaces between the element isolation insulating film 102 and the spacer 105, and the titanium film 107 due to reduction by the titanium film 107. For this reason, as shown in FIG. 2D, a titanium nitride layer 110 and the non-silicified titanium film 107 are removed by an aqueous ammonia solution, and a heat treatment is performed to convert the silicide layers 109 of the C49 structure into silicide layers 112 of the C54 structure having a lower resistivity (FIG. 2E).

In either of the above-mentioned conventional methods, in heat treatment upon film formation of the titanium film, titanium oxide films are formed due to reduction by titanium at the interfaces between the titanium film, and the element isolation insulating film and the spacer which are made of silicon oxide films. As will be described in detail later, this titanium oxide film cannot be removed by an etching solution containing an aqueous ammonia solution as a component, and further exhibits semiconductor properties. For this reason, the titanium oxide film causes a leakage current across the gate electrode and the diffusion layer regions and poses a problem in processing.

According to the first conventional method, by a heat treatment in the nitrogen atmosphere, the titanium film on the silicon oxide film has a three-layered structure of a titanium nitride layer, an oxygen-containing titanium layer, and a titanium oxide film. A detailed mechanism of this structure is as follows. That is, in this heat treatment step, the surface oxygen concentration of the titanium film decreases due to reduction by nitrogen, and as the nitride film is formed, oxygen diffuses into the titanium film to form an oxygen-containing titanium layer. The snowplow effect of oxygen due to nitridation by nitrogen ($N_2$ gas) becomes dominant, while reduction of the titanium oxide film becomes deficient. As a result of this oxygen diffusion, the titanium film on the silicon oxide film has a three-layered structure of a titanium nitride layer, an oxygen-containing titanium layer containing a large amount of oxygen, and a titanium oxide film.

After heat treatment, the titanium film is selectively etched. In selective etching, the oxygen-containing titanium layer remaining on the silicon oxide film is etched by using a solution mixture of ammonia and a hydrogen peroxide solution, thereby removing the titanium nitride layer by the lift-off effect. However, the etching rate of the oxygen-containing titanium layer decreases with an increase in oxygen concentration. The titanium oxide film is not etched by the solution mixture of ammonia and the hydrogen peroxide solution. Although the titanium oxide film may be etched by prolonging the etching time and increasing the solution temperature, since the etching rate of the silicide layer of the C49 structure also increases, the selectivity is not actually improved. As a result, it is difficult to remove the titanium oxide film.

According to the second conventional method, film formation of the titanium film and a heat treatment are continuously performed without exposing the structure to the outer atmosphere. In this case, since oxygen diffusion due to nitridation does not take place, no oxygen-containing titanium layer is formed. However, a titanium oxide film generated due to reduction by titanium still exists, which causes a leakage current.

FIGS. 3A and 3B are graphs of frequency distributions respectively showing the measurement results of the leakage current across the gate electrode and the diffusion layer in a large number of MOS transistors formed by the above-described conventional methods. FIG. 3A shows the result obtained in the MOS transistor according to the first conventional method, and FIG. 3B shows the result obtained in the MOS transistor according to the second conventional method. As is apparent from the two graphs, the frequency of the leakage current in the second method is lower than that in the first method, but in either case a leakage current of $10^{-6}$ A or more flows, which cannot be ignored in relation to the OFF current of the transistor.

SUMMARY OF THE INVENTION

The present invention has been made in consideration of the above situation, and has as its object to provide a method of manufacturing a semiconductor device in which such processing as to prevent a refractory metal oxide from remaining is performed in forming a self-align-silicide (salicide) layer of a refractory metal in a predetermined region of a semiconductor element on a silicon substrate, thereby reducing the leakage current across, e.g., a gate electrode and a diffusion layer.

To achieve the above object, according to the basic aspect of the present invention, there is provided a method of manufacturing a semiconductor device in which a silicide layer of a refractory metal is formed in a predetermined region of a semiconductor element formed on a silicon semiconductor substrate, comprising the first film formation step of forming a first thin film consisting of the refractory metal on surfaces of the silicon semiconductor substrate and the semiconductor element, the first heat treatment step of performing a heat treatment with respect to the silicon semiconductor substrate, the semiconductor element, and the first thin film to form a silicide layer, the first removal step of removing the first thin film by etching after execution of the first heat treatment step, the second film formation step of forming a second thin film consisting of a refractory metal of the same kind as that of the first thin film after execution of the first removal step, the second heat treatment step of performing a heat treatment to make the second thin film contain as a solid solution an oxide of the refractory metal present at an interface with the second thin film, thereby making a layer consisting of the oxide vanish, and the second removal step of removing the second thin film by etching after execution of the second heat treatment step.

In the present invention, the refractory metal means a metal having a melting point higher than that of silicon. As the refractory metal, for example, titanium, cobalt, tungsten, molybdenum, and tantalum can be preferably used. In the present invention, the heat treatment temperature in the second heat treatment step is preferably set to a temperature range wherein the second thin film does not silicify. To form a lower-resistance electrode or interconnection, the third heat treatment step of converting the silicide layer generated in the first heat treatment step into a silicide layer having a lower electrical resistivity may be executed after execution of the second removal step.

In the first and second removal steps, for example, a solution containing a hydrogen peroxide solution can be preferably used as an etching solution.

When titanium is used as the refractory metal, it is preferable that the first heat treatment step be executed in an atmosphere containing nitrogen in the temperature range of 500° C. to 800° C., and the second heat treatment step be performed in an atmosphere containing no nitrogen in the temperature range of 200° C. to 400° C. When titanium is used, the film thickness of the first thin film is preferably set to 30 nm or less in order to meet the demand for a thin silicide layer.

When cobalt is used as the refractory metal, the second heat treatment step is executed in the temperature range of 200° C. to 400° C., and the film thickness of the first thin film is preferably set to 20 nm or less in order to meet the demand for a thin silicide layer.

As is apparent from the above description, according to the present invention, in forming a silicide layer of a refractory metal in a predetermined region of a semiconductor element formed on a semiconductor substrate, in order to remove an oxide film formed upon oxidation of the refractory metal, a refractory metal film of the same kind is deposited again and a heat treatment is performed to make the refractory metal film side contain as a solid solution the oxide in the oxide film and make the oxide film vanish, and then the deposited refractory metal film is removed by etching. Since the deposited refractory metal film can be easily removed using a normal etching solution such as a solution prepared by mixing ammonia or sulfuric acid in a hydrogen peroxide solution, the oxide film of the refractory metal formed between the gate electrode and the diffusion layer can be removed. That is, the present invention has an effect of reducing the leakage current across the gate electrode and the diffusion layer.

The above and many other advantages, features and additional objects of the present invention will become manifest to those versed in the art upon making reference to the following detailed description and accompanying drawings in which preferred embodiments incorporating the principles of the present invention are shown by way of illustrative example.

DETAILED DESCRIPTION OF PREFERRED EMBODIMENTS

Several preferred embodiments of the present invention will be described below with reference to the accompanying drawings.

FIGS. 4A to 4G are sectional views respectively showing the steps in a salicide formation flow according to the first embodiment of the present invention. This embodiment exemplifies a case wherein a salicide is formed in an n-channel MOS transistor.

Figure 4A:
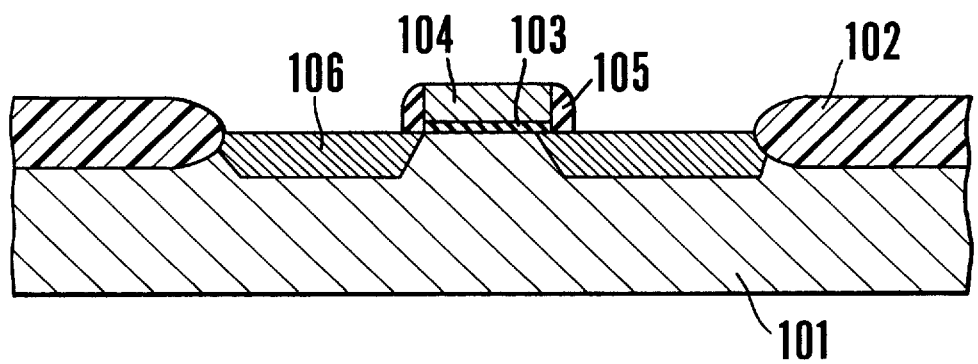
FIGS. 4A to 4G are sectional views respectively showing the steps in a salicide formation flow according to the first embodiment of the present invention.
Figure 4B:
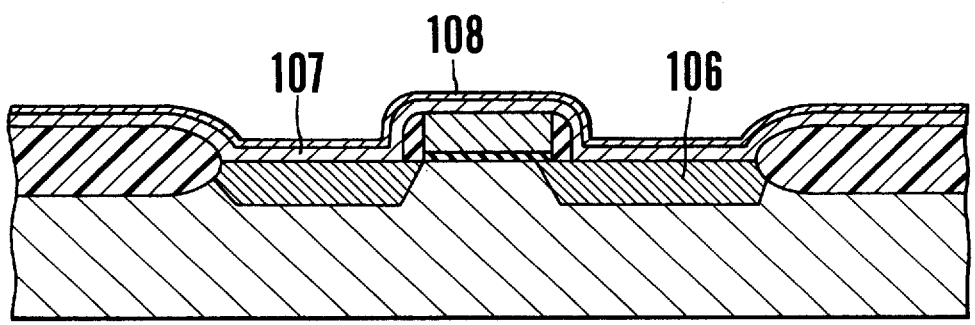

The steps from formation of the gate electrode and the diffusion layer of a MOS transistor to film formation of a titanium film by the sputtering method are performed almost similar to those in the above-mentioned conventional methods. That is, as shown in FIG. 4A, a 300 nm-thick element isolation insulating film 102 is formed by the LOCOS method in a predetermined region on a silicon substrate 101 which is of p-type or has a p-well formed therein. Boron for a channel stopper is ion-implanted to form a gate insulating film 103 having a film thickness of about 8 nm by the thermal oxidation method. A polysilicon film having a film thickness of about 100 nm is formed on the entire surface by the CVD method. After an impurity such as phosphorus is doped, this polysilicon film is patterned into a desired shape by the lithography technique and the dry etching technique to form a gate electrode 104. A silicon oxide film is deposited on the entire surface by the CVD method to have a film thickness of about 100 nm, and subjected to anisotropic dry etching to form a spacer 105 on the side surface of the gate electrode 104. Arsenic is ion-implanted, and a heat treatment is performed at about 900° C. to form diffusion layers 106. The dose of arsenic ions in the ion implantation is set to about $1 \times 10^{15}$ ions/cm$^2$. In this manner, the source and drain regions of the MOS transistor are formed. Next, as shown in FIG. 4B, a titanium film 107 having a thickness of about 20 nm is formed on the entire surface by the sputtering method or the like. The substrate is exposed to the outer atmosphere upon sputtering to form a titanium oxide film 108 on the uppermost surface of the titanium film 107.

Figure 4C:
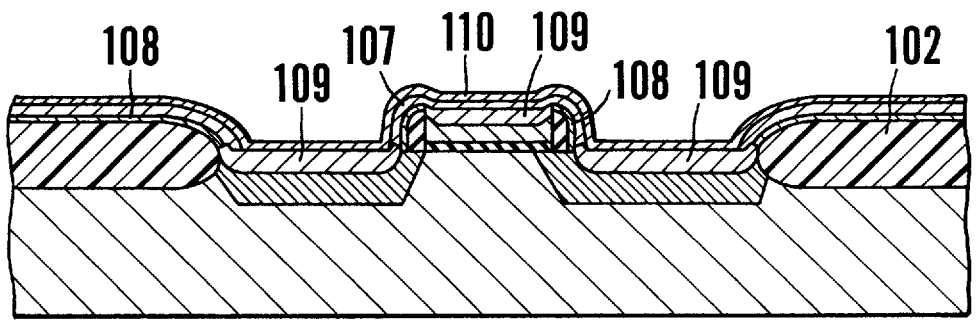
Figure 4D:
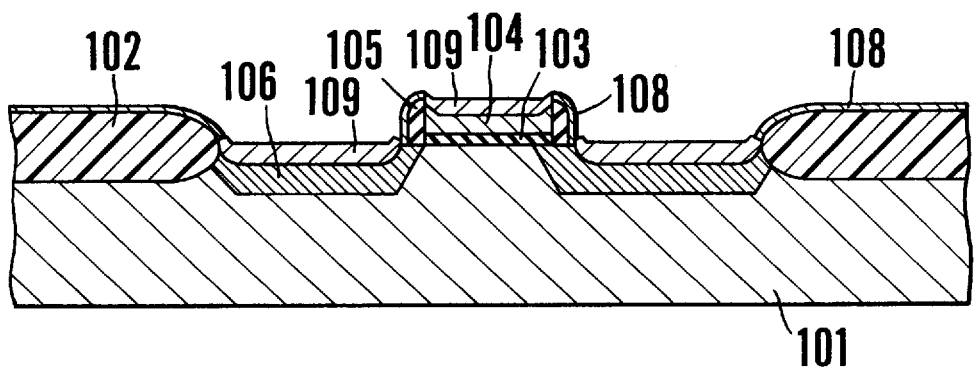

Subsequently, the first heat treatment is performed in the nitrogen atmosphere. As a result, as shown in FIG. 4C, the titanium film 107 on the silicon exposed surfaces (the diffusion layers 106 and the gate electrode 104) is silicified to form silicide layers 109 of the C49 structure, and titanium nitride layers 110 are formed on the silicide layers 109 of the C49 structure. On the other hand, in the regions on the silicon oxide films (the element isolation insulating film 102 and the spacer 105), titanium oxide films 108 are formed at the interfaces between the titanium film 107 and the silicon oxide films, and a titanium nitride layer 110 is formed on the titanium film 107. Then, etching processing is performed using an etching solution containing a hydrogen peroxide solution to remove the titanium nitride layers 110. Upon etching, the titanium oxide films 108 present on the silicon oxide films are not removed and remain (FIG. 4D).

Figure 4E:
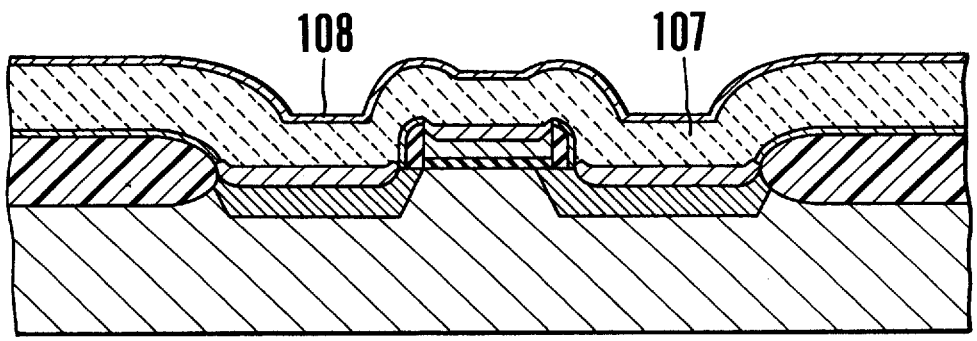

As shown in FIG. 4E, a titanium film 107 is formed again on the entire surface using the sputtering method or the like. The film thickness of a titanium film 107 in the second film formation is preferably larger than that of the first titanium film 107 (see FIG. 4B). The structure is exposed to the outer atmosphere after sputtering to form a titanium oxide film 108 on the surface of the titanium film 107.

Figure 4F:
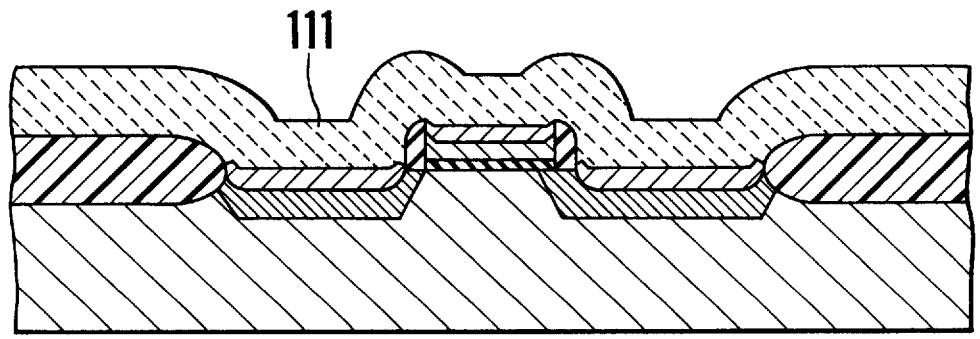
Figure 4G:
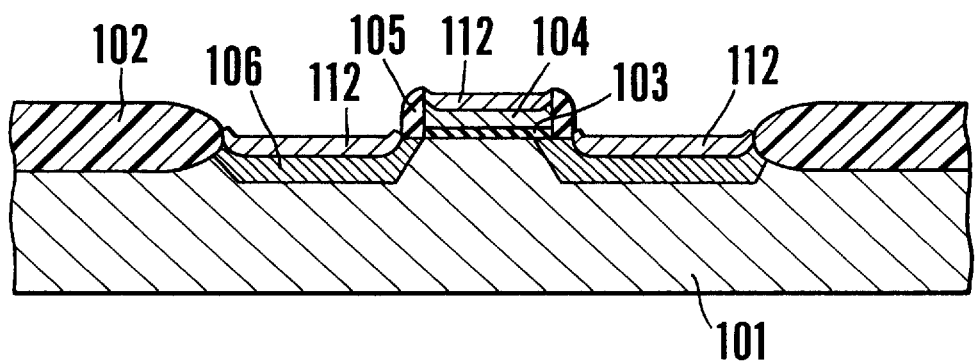

Next, the second heat treatment is performed in an atmosphere containing no nitrogen, and the titanium film 107 is made contain as a solid solution the titanium oxide films 108 present on the surface of the titanium film 107 and at the interfaces between the titanium film 107 and the silicon oxide films to convert the titanium film 107 into an oxygen-containing titanium layer 111 and make the titanium oxide films 108 vanish (FIG. 4F). The heat treatment is performed in the atmosphere containing no nitrogen to prevent generation of a titanium nitride layer which cannot be easily removed by an etching solution containing a hydrogen peroxide solution. Thereafter, the oxygen-containing titanium layer 111 is removed with an etching solution containing an ammonia solution and a hydrogen peroxide solution. Another heat treatment is performed at 850° C. to convert the silicide layers 109 of the C49 structure into silicide layers 112 of the C54 structure having a lower resistivity (FIG. 4G). By the above steps, a salicide containing no titanium oxide film can be formed.

Figure 5:
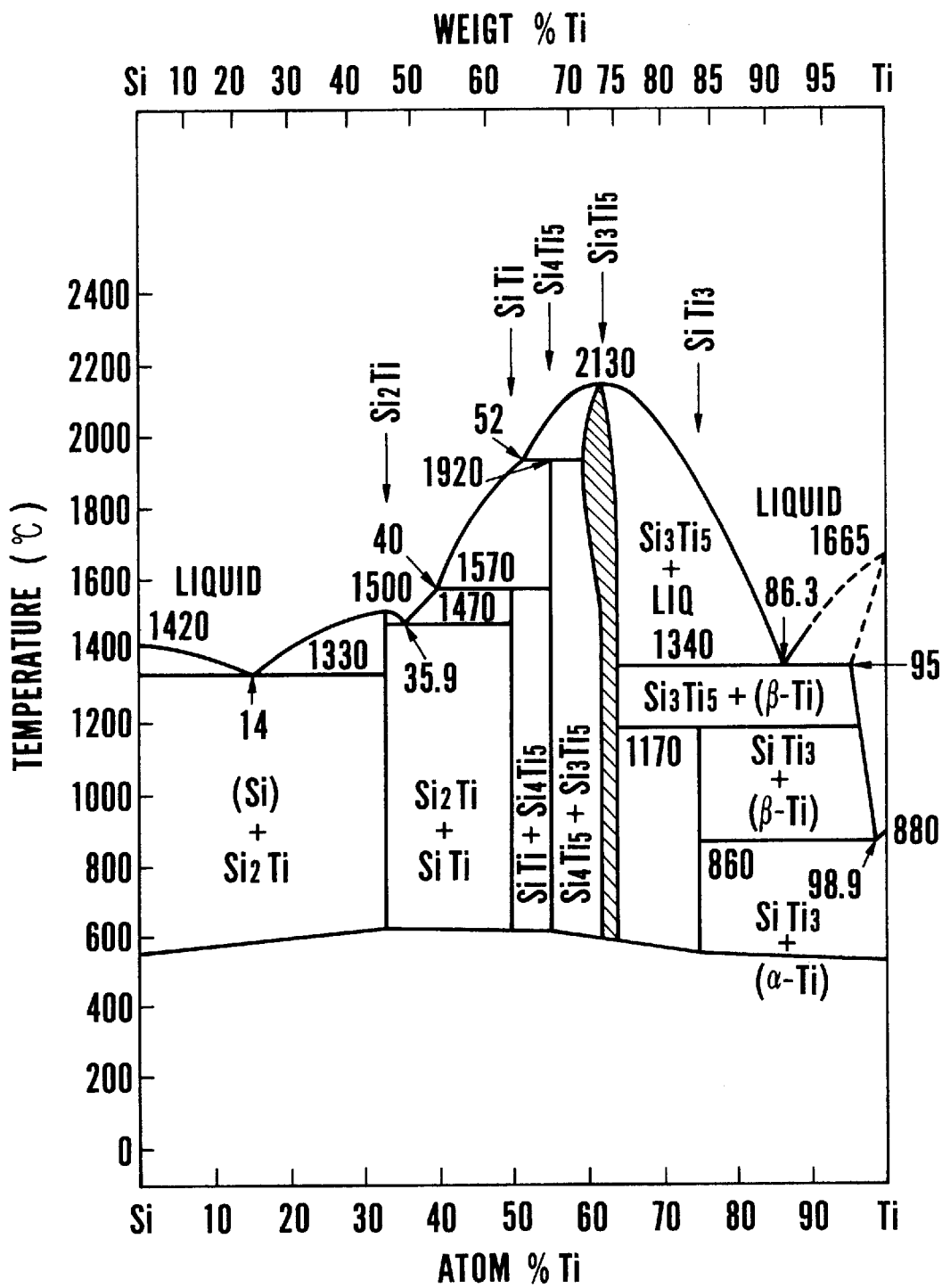
FIG. 5 is a phase diagram of a binary system of titanium and silicon.

The temperature of the second heat treatment in making the titanium film 107 contain the titanium oxide films 108 as a solid solution will be examined. In this process, a kind of auto-reduction by titanium occurs. Reduction of titanium generally takes place at room temperature. Taking the reaction rate and the diffusion rate of oxygen in the titanium film 107 into consideration, the temperature is desirably set to 200° C. or more. In addition, since the thickness of the silicide film must be decreased to realize a higher integrated semiconductor device, as described in "DESCRIPTION OF THE PRIOR ART", the titanium film 107 in the second film formation must be prevented from being silicified. FIG. 5 is a phase diagram showing a binary system of titanium and silicon. As is apparent from this phase diagram, the silicide is not formed at 400° C. or less. As a result, the heat treatment temperature in making the titanium film 107 contain the titanium oxide as a solid solution is preferably 200° C. to 400° C.

The present invention is not limited to formation of a salicide by titanium but preferably used for formation of a salicide by another refractory metal. A case wherein a salicide of cobalt will be explained. As for cobalt, since no metal nitridation occurs even upon a heat treatment for silicification in a nitrogen atmosphere, nitridation does not accompany precipitation of oxygen. Therefore, the nitride film need not be removed, and only a cobalt oxide film formed by reduction of the silicon oxide film or the like is removed. FIGS. 6A to 6G are sectional views respectively showing the steps in salicide formation according to the second embodiment. This embodiment exemplifies a case wherein salicide formation is performed with respect to an n-channel MOS transistor.

Figure 6A:
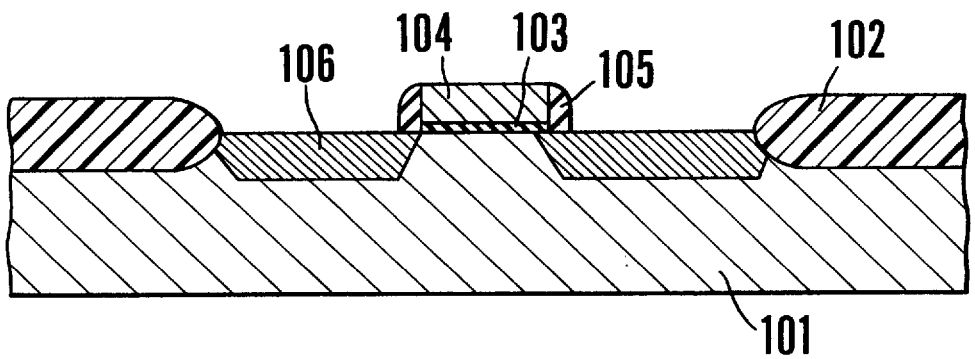
FIGS. 6A to 6G are sectional views respectively showing the steps in a salicide formation flow according to the second embodiment of the present invention.
Figure 6B:
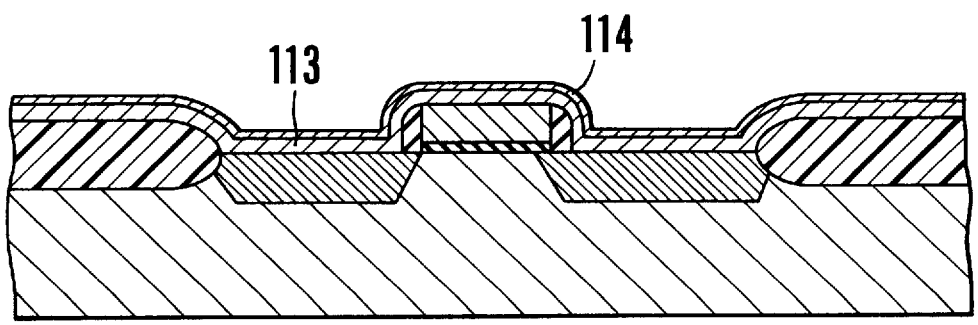

The steps from formation of the gate electrode and the diffusion layer of a MOS transistor to film formation of a cobalt film by the sputtering method are performed almost similar to those in the above-mentioned conventional methods. That is, as shown in FIG. 6A, a 300 nm-thick element isolation insulating film 102 is formed by the LOCOS method in a predetermined region on a silicon substrate 101 which is of p-type or has a p-well formed therein. Boron for a channel stopper is ion-implanted to form a gate insulating film 103 having a film thickness of about 8 nm by the thermal oxidation method. A polysilicon film having a film thickness of about 100 nm is formed on the entire surface by the CVD method. After an impurity such as phosphorus is doped, this polysilicon film is patterned into a desired shape by the lithography technique and the dry etching technique to form a gate electrode 104. A silicon oxide film is deposited on the entire surface by the CVD method to have a film thickness of about 100 nm, and subjected to anisotropic dry etching to form a spacer 105 on the side surface of the gate electrode 104. Arsenic is ion-implanted, and a heat treatment is performed at about 900° C. to form diffusion layers 106. The dose of arsenic ions in the ion implantation is set to about $1 \times 10^{15}$ ions/cm$^2$. In this manner, the source and drain regions of the MOS transistor are formed. Next, as shown in FIG. 6B, a cobalt film 113 having a thickness of about 10 nm is formed on the entire surface by using sputtering using argon gas. The substrate is exposed to the outer atmosphere upon sputtering to form a cobalt oxide film 114 on the uppermost surface of the cobalt film 113.

Figure 6C:
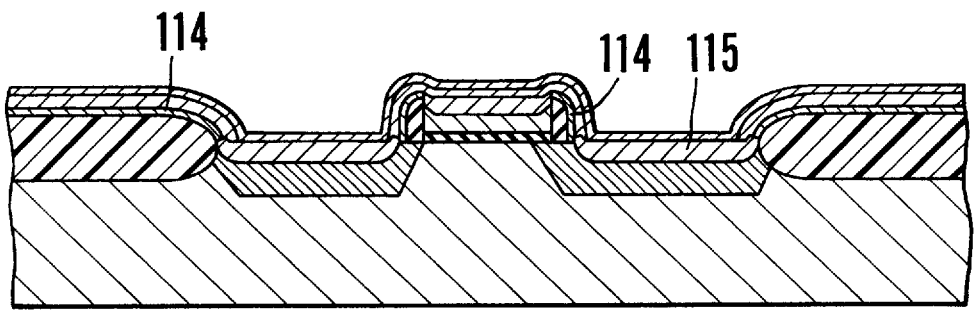
Figure 6D:
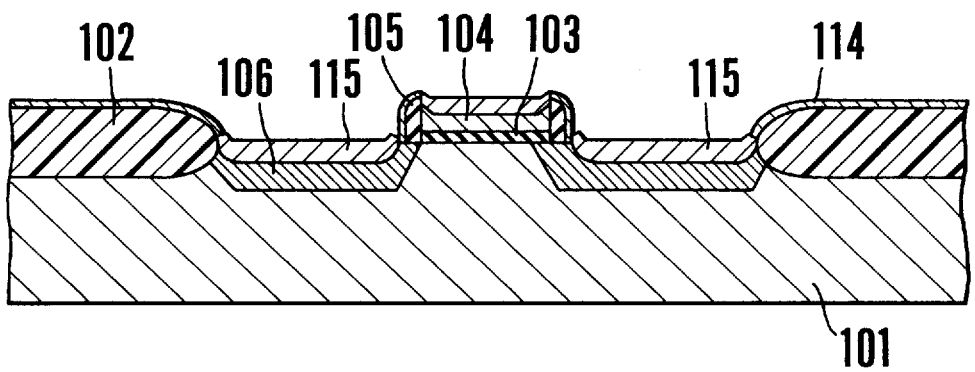

Next, another heat treatment is performed in a nitrogen atmosphere at 500° C. for about 30 sec, thereby forming cobalt monosilicide films 115 in the silicon exposed surface (the gate electrode 104 and the diffusion layers 106; FIG. 6C). Note that the atmosphere in this heat treatment may be an argon atmosphere or an ammonia atmosphere containing nitrogen. By this heat treatment, cobalt oxide films 114 are formed on the surfaces of the silicon oxide films (the element isolation insulating film 102 and the spacer 105). Subsequently, the cobalt films 113 remaining on the silicon oxide films are removed by a solution mixture of sulfuric acid and a hydrogen peroxide solution. As a result, as shown in FIG. 6D, the cobalt monosilicide films 115 are selectively formed on the silicon surface.

Figure 6E:
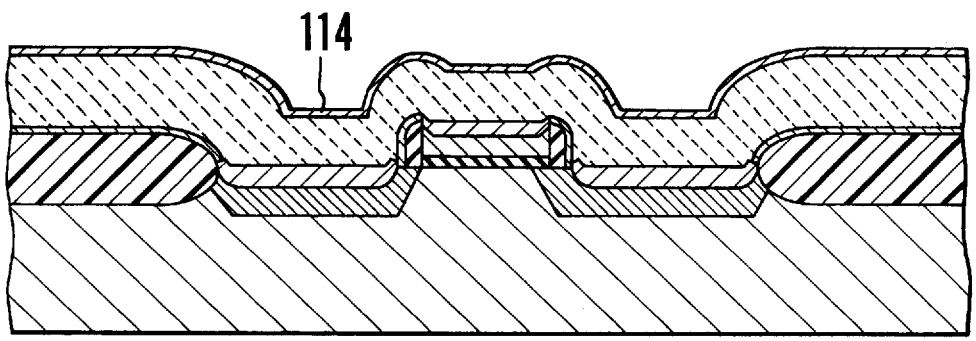
Figure 6F:
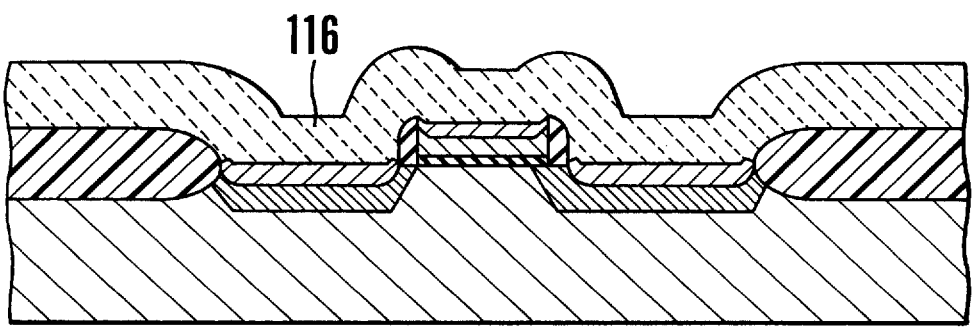
Figure 6G:
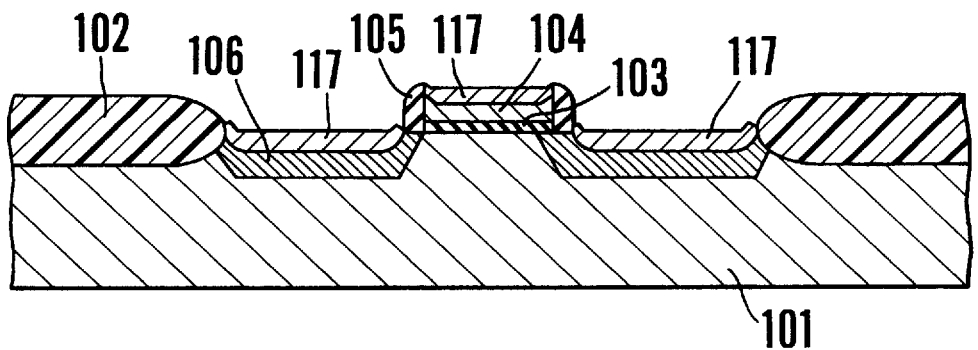

As shown in FIG. 6E, another cobalt film 113 is formed by the sputtering method or the like. The film thickness at this time is preferably larger than that of the cobalt film 113 in the first film formation. The structure is exposed to the outer atmosphere upon film formation to form a cobalt oxide film 114 on the uppermost surface of the cobalt film 113. A heat treatment is executed in an atmosphere containing no nitrogen (an inert atmosphere containing nitrogen is also possible because cobalt does not react with nitrogen) into to make the cobalt film 113 contain the cobalt oxide as a solid solution so as to convert the cobalt film 113 into an oxygen-containing cobalt layer 116 and make the cobalt oxide film 114 vanish (FIG. 6F). Although reduction by cobalt generally starts at 100° C., the heat treatment temperature is preferably 200° C. or more. To prevent a new silicide layer from being formed, the upper limit of the heat treatment temperature is 400° C. Therefore, it is preferable to perform the heat treatment within the temperature range of 200° C. to 400° C. Thereafter, the oxygen-containing cobalt layer 116 is removed using an etching solution containing sulfuric acid and a hydrogen peroxide solution. Finally, a heat treatment at about 800° C. is performed to convert the cobalt monosilicide films 115 into cobalt disilicide layers 117 having a lower electrical resistivity (FIG. 6G). In this manner, formation of a salicide using cobalt is completed.

Figure 1A:
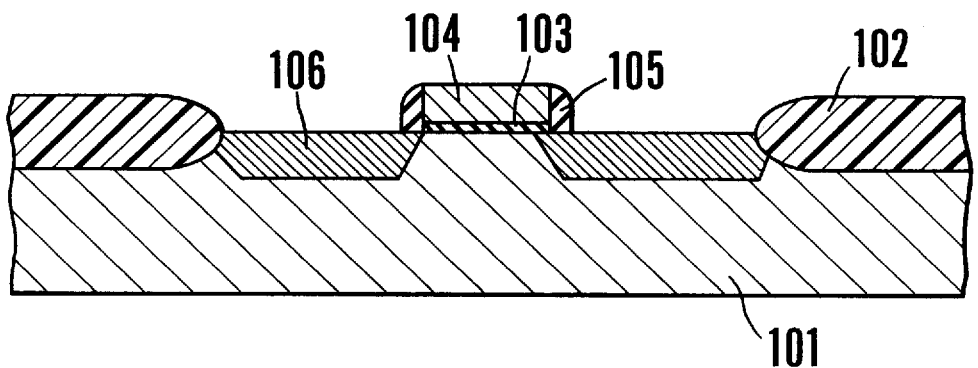
FIGS. 1A to 1E are sectional views respectively showing the steps in a salicide formation flow according to the first conventional method.
Figure 1B:
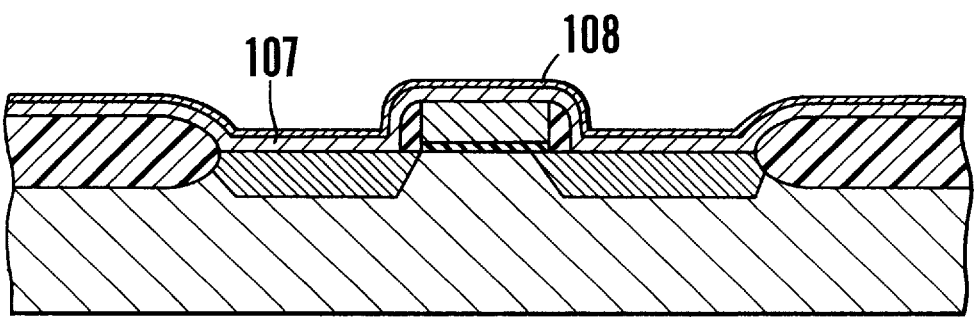
Figure 1C:
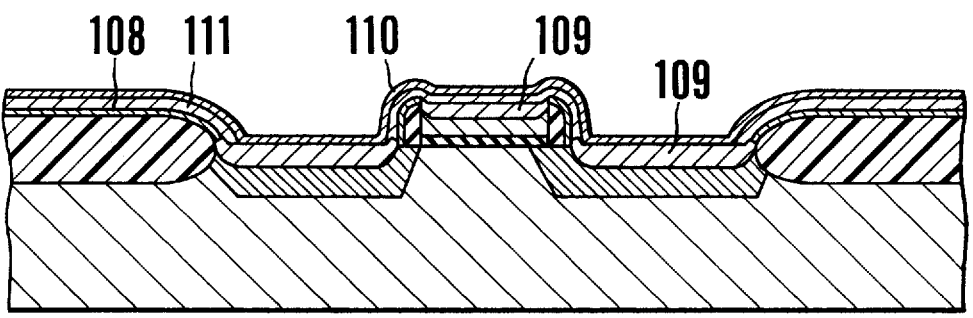
Figure 1D:
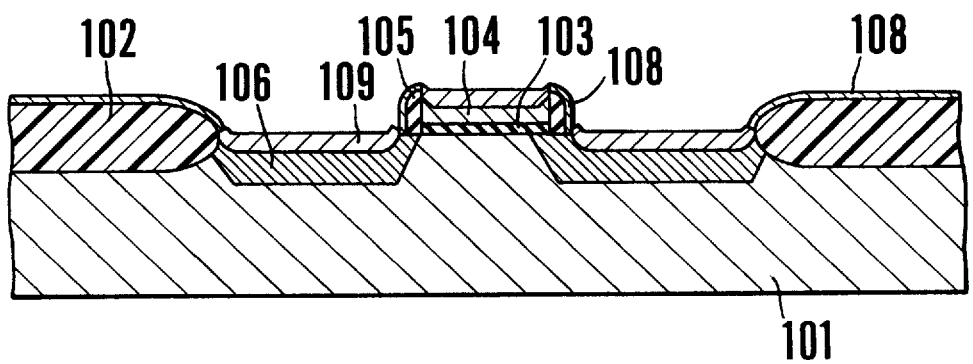
Figure 1E:
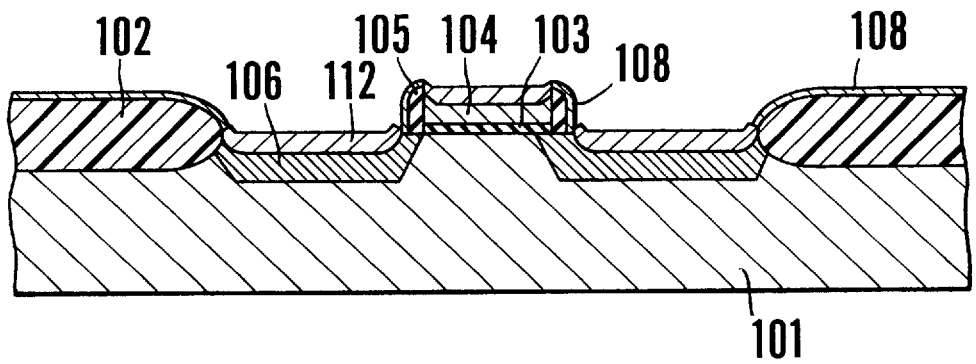
Figure 2A:
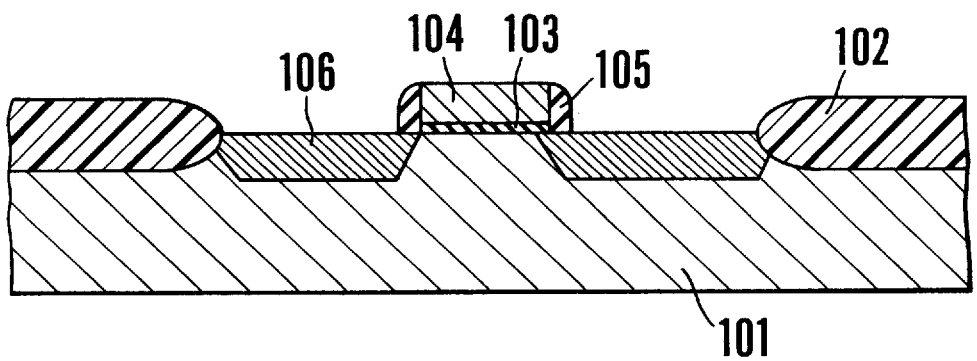
FIGS. 2A to 2E are sectional views respectively showing the steps in a salicide formation flow according to the second conventional method.
Figure 2B:
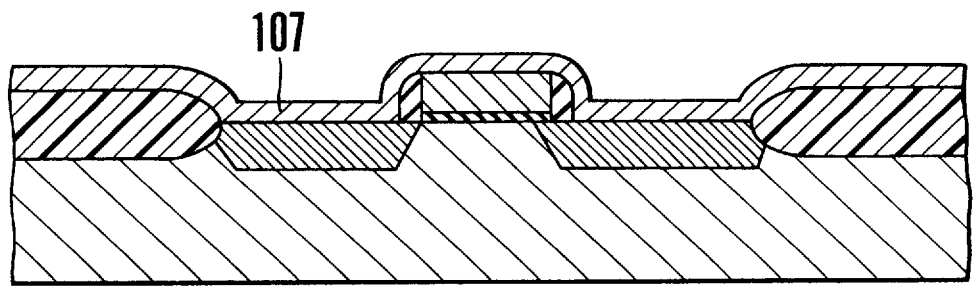
Figure 2C:
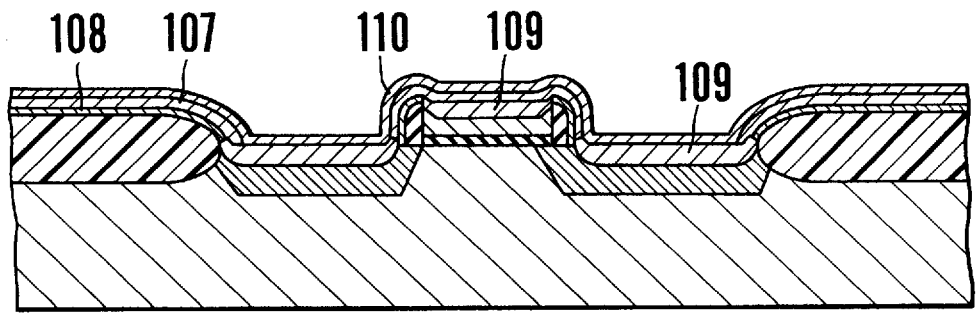
Figure 2D:
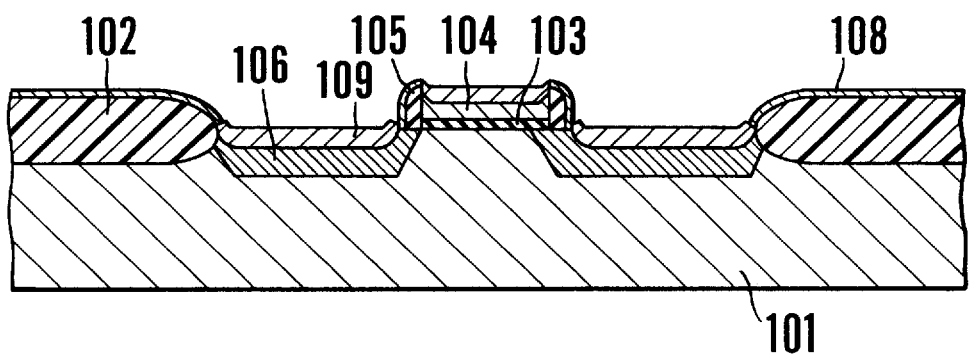
Figure 2E:
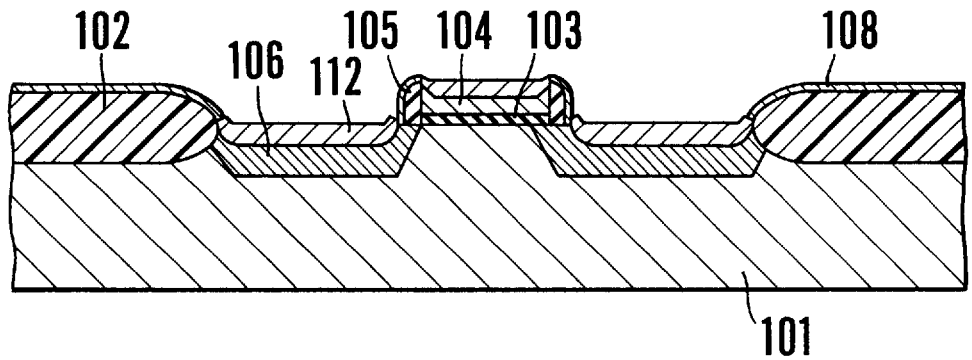
Figure 3A:
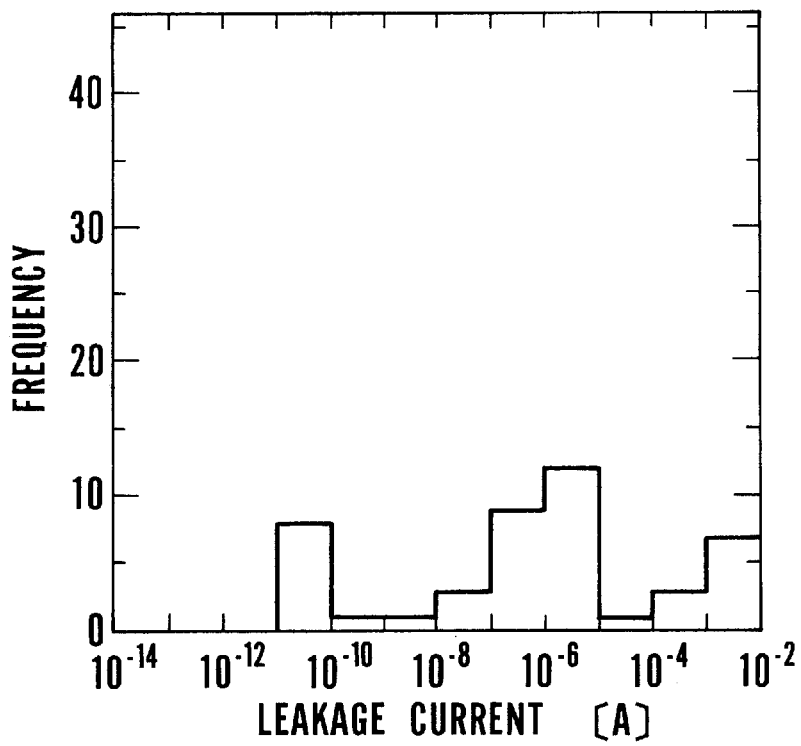
FIGS. 3A and 3B are graphs respectively showing the measurement results of the leakage current across the gate electrode and the diffusion layer in a large number of MOS transistors in which a salicide is formed by using the first and second conventional methods.
Figure 3B:
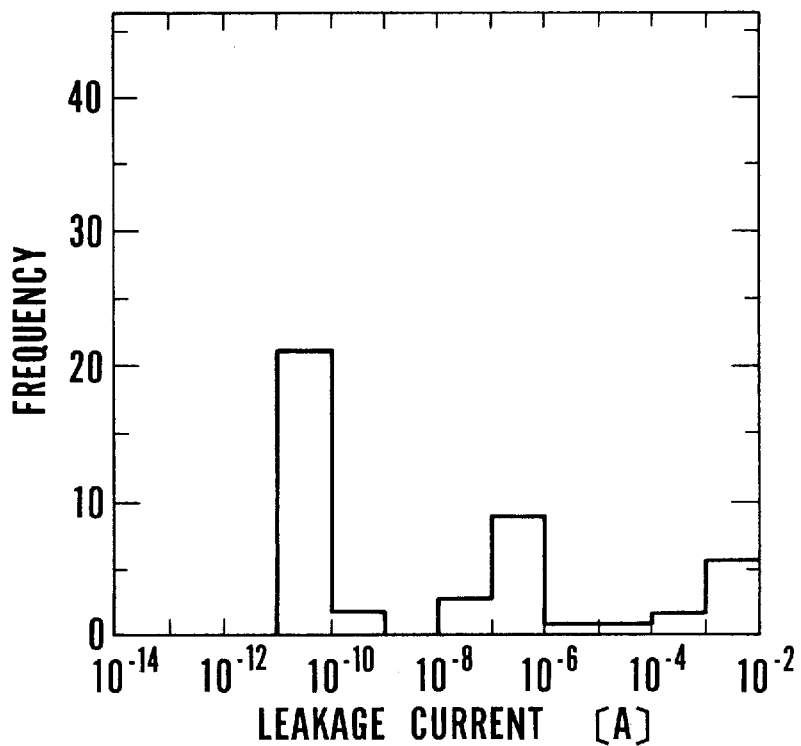
Figure 7:
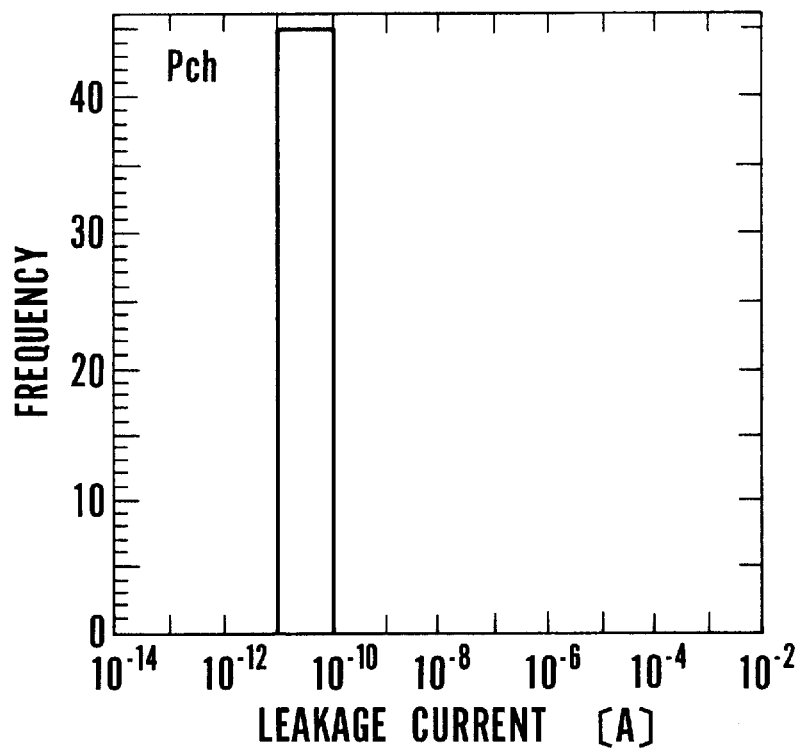
FIG. 7 is a graph showing the measurement result of the leakage current across the gate electrode and the diffusion layer in a large number of MOS transistors in which a salicide is formed using the method of the present invention.

FIG. 7 is a histogram showing the frequency distribution of the leakage current between the gate electrode and the diffusion layer in a large number of MOS transistors in which a salicide is formed by using the method of the present invention. As is apparent from FIG. 7, the leakage current is smaller than that in the conventional methods (see FIGS. 3A and 3B), and decreases to $10^{-10}$ A or less at the worst, which is sufficiently negligible in relation to the OFF current of the transistor.

What we claimed is:

1. A method of manufacturing a semiconductor device in which a silicide layer of a refractory metal is formed in a predetermined region of a semiconductor element formed on a silicon semiconductor substrate, comprising:

the first film formation step of forming a first thin film including the refractory metal on surfaces of said silicon semiconductor substrate and said semiconductor element;

the first heat treatment step of performing a heat treatment with respect to said silicon semiconductor substrate, said semiconductor element, and said first thin film to form a silicide layer;

the first removal step of removing said first thin film by etching after execution of the first heat treatment step;

the second film formation step of forming a second thin film including the refractory metal after execution of the first removal step;

the second heat treatment step of performing a heat treatment to make said second thin film contain, as a solid solution, an oxide of the refractory metal present at an interface with said second thin film, thereby eliminating a layer including the oxide; and the second removal step of removing said second thin film by etching after execution of the second heat treatment step;

wherein the second heat treatment step is performed at a temperature at which said second thin film does not silicify.

2. A method according to claim 1, wherein the first heat treatment step is performed in an atmosphere containing nitrogen, and the second heat treatment step is performed in an atmosphere containing no nitrogen.

3. A method according to claim 2, wherein the refractory metal is titanium, the first heat treatment step is performed in a temperature range of 500° C. to 800° C., and the second heat treatment step is performed in a temperature range of 200° C. to 400° C.

4. A method according to claim 3, wherein said first thin film has a film thickness of not more than 30 nm.

5. A method according to claim 1, wherein the refractory metal is cobalt, and the second heat treatment step is performed in a temperature range of 200° C. to 400° C.

6. A method according to claim 5, wherein said first thin film has a film thickness of not more than 20 nm.

7. A method according to any one of claims 1 and 2–6, wherein the first removal step and the second removal step use an etching solution containing a hydrogen peroxide solution.

8. A method according to any one of claims 1 and 2–6, further comprising the third heat treatment step of converting said silicide layer generated in the first heat treatment step into a silicide layer having a lower electrical resistivity after execution of the second removal step.

* * * * *